United States Patent [19]

Stimson

[11] Patent Number: 5,098,244
[45] Date of Patent: Mar. 24, 1992

[54] SEMICONDUCTOR WAFER CASSETTE HANDLING CART

[75] Inventor: William C. Stimson, Phoenix, Ariz.

[73] Assignee: SGS-Thomson Microelectronics, Inc., Carrollton, Tex.

[21] Appl. No.: 359,843

[22] Filed: May 31, 1989

[51] Int. Cl.⁵ ............................................. B25J 1/00
[52] U.S. Cl. ................................... 414/7; 414/590; 414/744.3
[58] Field of Search ............... 414/608, 672, 679, 772, 414/776, 778, 782, 757, 756, 744.3, 744.6, 744.7, 589, 590

[56] References Cited

U.S. PATENT DOCUMENTS

| 3,063,575 | 11/1962 | Fontana | 414/776 |
| 4,181,465 | 1/1980 | Ridderström | 414/590 |
| 4,289,441 | 9/1981 | Inaba et al. | 414/589 |
| 4,322,198 | 3/1982 | Zuber | 414/776 X |
| 4,383,788 | 5/1983 | Sylvander | 414/744.3 X |
| 4,884,938 | 12/1989 | Fujita et al. | 414/590 X |

FOREIGN PATENT DOCUMENTS 603577 4/1978 U.S.S.R. ............... 414/744.6

Primary Examiner—Joseph E. Valenza
Assistant Examiner—Keith L. Dixon
Attorney, Agent, or Firm—Kenneth C. Hill; Richard K. Robinson; Lisa K. Jorgenson

[57] ABSTRACT

A cassette handling tool according to the present invention utilizes a mobile cart for handling and transporting wafer cassettes. At one end of the cart is a holder which is adapted for holding and carrying wafer cassettes. At an opposite end of the cart is a handle by which an operator can manipulate the position and orientation of the cassette holder.

14 Claims, 3 Drawing Sheets

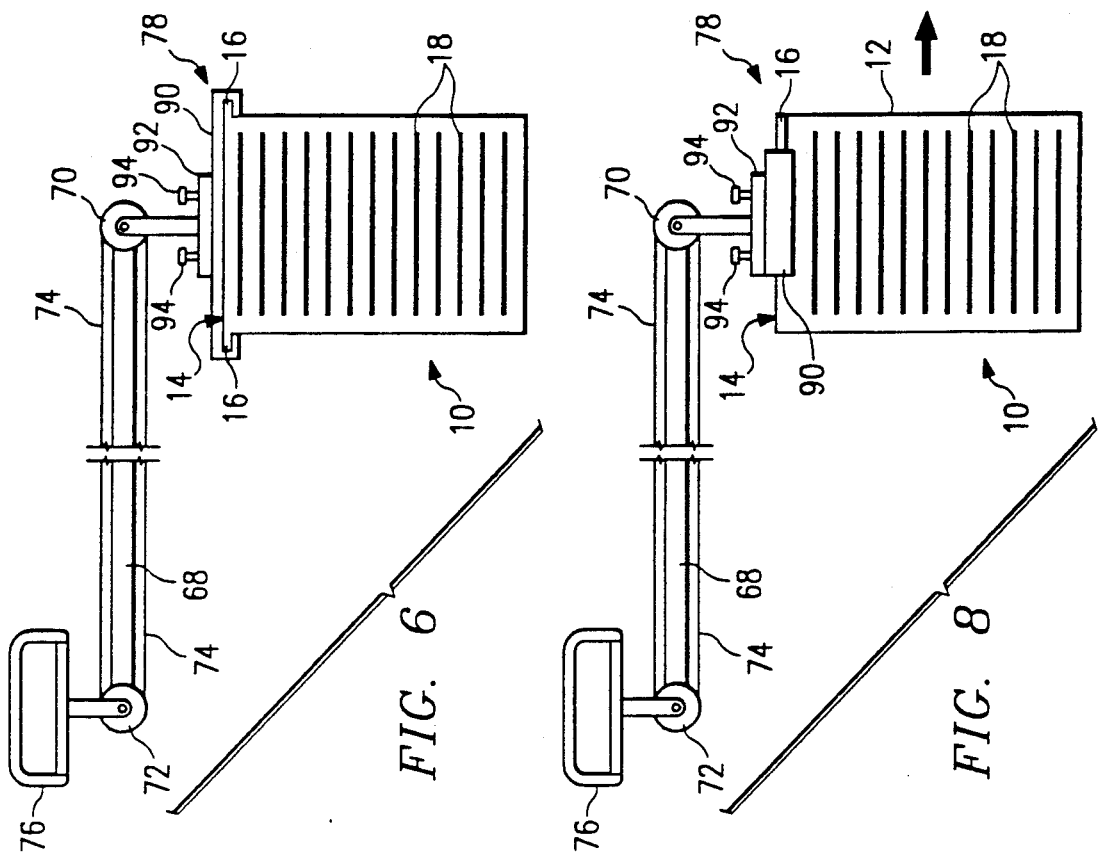
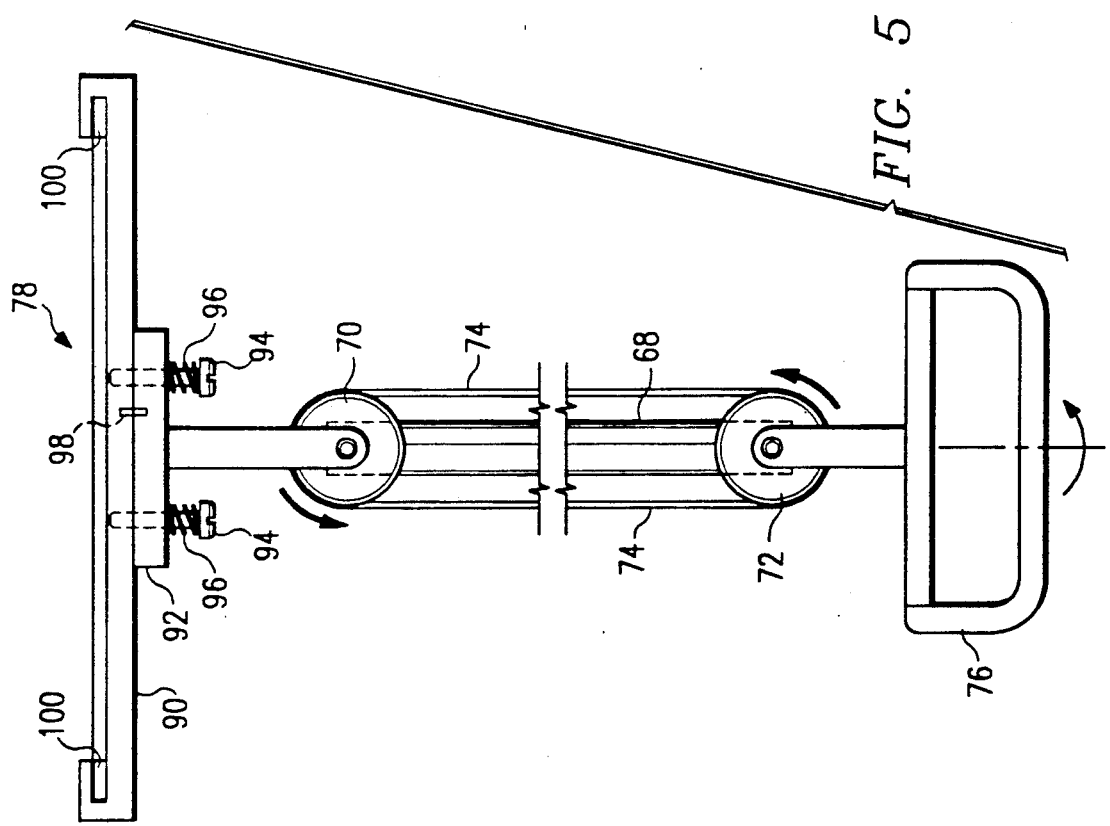

SEMICONDUCTOR WAFER CASSETTE HANDLING CART

BACKGROUND OF THE INVENTION

1. Field of the Invention

The present invention relates generally to semiconductor integrated circuit handling equipment, and more specifically to a tool for handling cassettes of semiconductor wafers during processing.

2. Description of the Prior Art

It is well known that integrated circuits must be fabricated in extremely clean environments. Particles which adhere to the surface of an integrated circuit during fabrication can completely ruin that circuit. Typically, damage caused by particulate contamination on an integrated circuit cannot be repaired, and that circuit must be discarded.

Particulate contamination is of special concern as the lithography used to define active regions and interconnect on integrated circuits becomes smaller. As integrated circuit geometries shrink below one micron in size, they become vulnerable to catastrophic contamination by ever smaller particles. If badly located, a single particle only a few microns across can completely ruin one integrated circuit.

People working in fabrication clean rooms generate a large number of particles which can contaminate the integrated circuits under fabrication. It is often estimated that 25% or more of the particulate contamination in a clean room comes from the people working there. This is true even though fabrication facility personnel wear clean garments over their normal work clothes, cover their hands, face, and hair, are air dusted clean prior to entering a clean room, and completely refrain from extremely contaminating activities such as smoking or eating in the clean room. Even when all reasonable precautions are taken, people in the clean room continue to generate a significant amount of the particulate contamination seen during integrated circuit fabrication.

Clean room designers have gone to great lengths to minimize particulate contamination. Constant air flow in a clean room, combined with extremely efficient filters, helps remove particles from the air as quickly as possible. This air flow is typically vertical from the ceiling to floor in order to minimize the length of time, and thus potential travel distance, which particles spend in the clean room.

Handling of integrated circuits by people is also minimized. Semiconductor wafers are usually transported in cassettes holding up to 25 wafers. Machines in the fabrication facility are designed to remove wafers from the cassette and replace them after processing without human interference. Other facilities have eliminated humans entirely from at least part of the work area, performing as much wafer cassette transport and handling as possible using automated methods such as robots.

Because of various cost and facility design considerations, it is not always possible to eliminate handling of wafer cassettes by humans. Even in facilities which will eventually be completely automated, cost considerations and debugging of process flows may require that integrated circuits be produced with humans handling the wafer cassettes prior to the robots being installed.

Therefore, there are many situations in which human handling of wafer cassettes is unavoidable. As cassettes are carried from place to place, it is desirable for them to be held away from the body as far as possible in order to lessen contamination. However, as the diameter of semiconductor wafers used in integrated circuit processing becomes larger, the cassettes used to carry them become heavier. This tends to cause a person carrying the cassette to hold it closer to their body, increasing potential particulate contamination.

As would be expected, experiments have confirmed that separating wafer cassettes as far as possible from people handling them lessens contamination. In fabrication facilities with a constant vertical air flow, tests have shown that air flowing at velocities of approximately 100 feet per minute or more can essentially eliminate particle contamination from a person if the wafer cassette can be separated from that person by distances of at least 12 to 16 inches at all times.

It would therefore be desirable to provide a tool for use in fabrication facilities which allows wafer cassette handling while always maintaining a minimum desired separation between the human operator and the wafer cassette. It would be further desirable for such a tool to provide for simple loading and unloading in fabrication facility machines which require that the cassette be placed in various locations and orientations.

SUMMARY OF THE INVENTION

It is therefore an object of the present invention to provide a tool for handling semiconductor wafer cassettes in fabrication facilities which provides a desired minimum separation between a human operator and the wafer cassette at all times.

It is a further object of the present invention to provide such a cassette handling tool which can easily load and unload cassettes from machines in a variety of locations and orientations.

It is another object of the present invention to provide such a cassette handling tool which is simple and inexpensive to construct.

Therefore, according to the present invention, a cassette handling tool according to the present invention utilizes a mobile cart for handling and transporting wafer cassettes. At one end of the cart is a holder which is adapted for holding and carrying wafer cassettes. At an opposite end of the cart is a handle by which an operator can manipulate the position and orientation of the cassette holder.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIG. 5 is a view of a portion of the handling mechanism of a cart according to the present invention;

FIG. 6 is a side view of the mechanism of FIG. 5 showing one possible orientation thereof;

FIG. 8 illustrates another orientation of the mechanism of FIG. 5.

DESCRIPTION OF THE PREFERRED EMBODIMENT

The embodiment of a wafer cassette handling cart 10 described below is easily adaptable for use with cassettes having varying sizes and design characteristics. In most cases, specific dimensions of various parts of the cart will not be described. Determination of dimensions suitable for a particular application will become apparent to those skilled in the art. In cases where dimensions are given, they are approximate dimensions only of a preferred embodiment, and the scope of the invention is not intended to be restricted to such dimensions.

Figure 1:
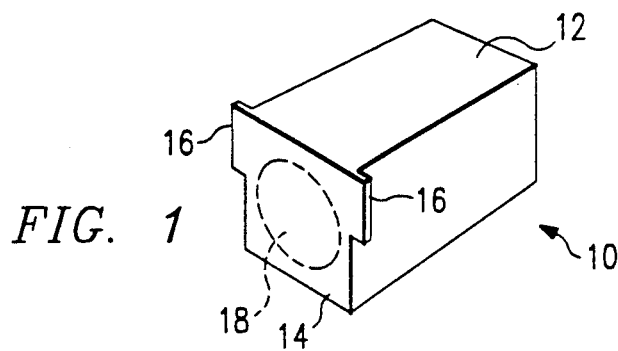
FIG. 1 is an outline of an semiconductor wafer cassette for holding and transporting wafers during fabrication.

Referring to FIG. 1, a semiconductor wafer cassette 10 consists, essentially, of a rectangular box. FIG. 1 does not illustrate all of the details of a typical cassette 10, including only the essential features thereof which are necessary for an understanding of the present invention. The cassette 10 has a top side 12 and a front side 14. Handling tabs 16 project from either side of the front side 14 and extend from a point near the top side 12 to a location approximately half way down the front side 14. Handling tabs 16 are used for lifting and positioning the cassette 10 by various handling mechanisms. The handler described below makes use of the tabs 16 to manipulate the cassette 10.

Semiconductor wafers 18 are oriented in the cassette 10 as shown. Generally, up to 25 wafers are carried in parallel in a single cassette 10, separated by a distance of a few millimeters. Wafers 18 are removed from the cassette 10, by handling machinery, through the top side 12.

Figure 2:
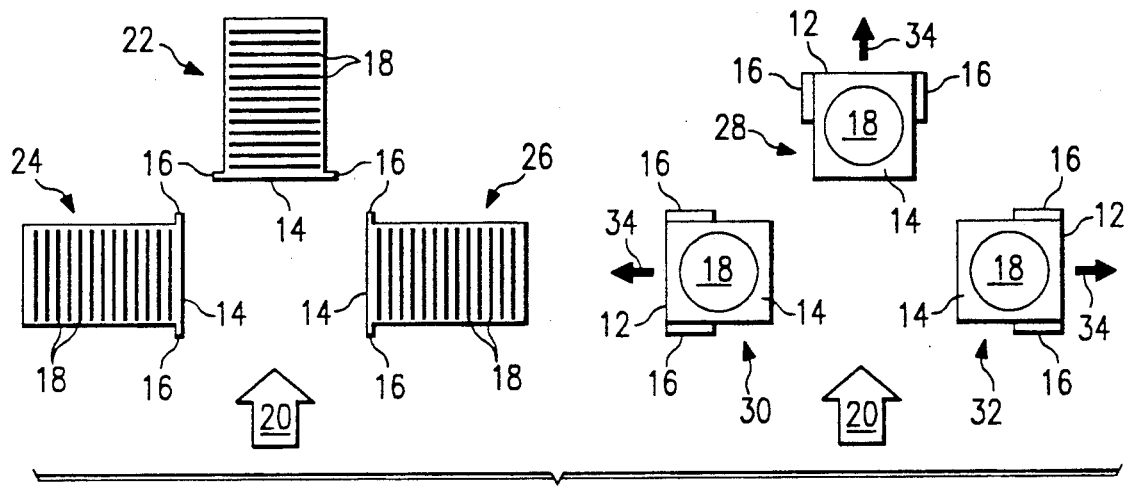
FIG. 2 illustrates several possible orientations for loading a wafer cassette into a processing machine.

FIG. 2 illustrates the six typical orientations in which a cassette 10 may need to be placed in a piece of machinery in a typical fabrication facility. Since different processing equipment is manufactured by different companies, there is no industry standard location and orientation for loading wafer cassettes into processing equipment. In order to ensure that the handling cart will operate properly with the majority of available equipment, it must be capable of positioning the cassette 10 in any of the orientations shown in FIG. 2.

Directional arrows 20 indicate the direction from which a cassette mounted on a cart is loaded into a machine. All views in FIG. 2 are from above as the cassette 10 is loaded into the machine.

Orientation 22 shows the cassette being loaded horizontally with the front side 14 facing the handling cart. Positions 24 and 26 also show a horizontal loading orientation, but in these cases the cassette is pivoted 90° so that the plane of the front side 14 is at right angles to that of orientation 22. In all three orientations 22, 24, 26, the top side 12 of the cassette lies in the plane of the drawing, facing out from the page. The wafers 18 within the cassettes in orientations 22, 24, 26 are seen to be oriented perpendicular to the plane of the drawing.

In orientations 28, 30, and 32, the cassettes have been tilted 90° from orientations 22, 24, and 26 respectively so that the wafers 18 contained therein now lie parallel to the plane of the drawing. The front side 14 faces out of the drawing, with the top sides 12 are positioned as shown. Arrows 34 indicate the direction from which wafers 18 will be removed from the cassettes. As described above, the wafers 18 are removed from the cassettes through the top side 12.

Figure 3:
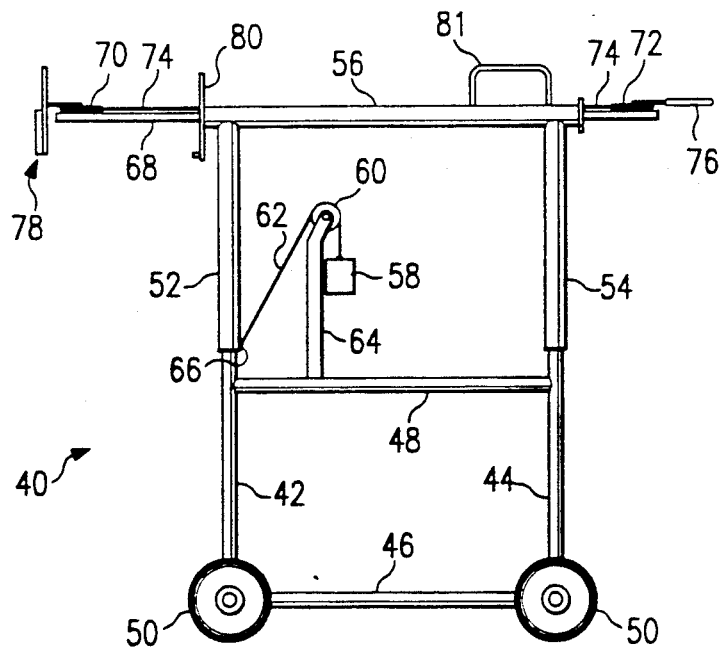
FIG. 3 is a side view of a cassette handling cart according to the present invention.

Referring to FIG. 3, a cassette handling cart 40 is shown which is capable of placing cassettes 10 into a machine in any of the orientations shown in FIG. 2. Construction of the cart 40 is not shown in detail, with only the major structural components being indicated. The cart 40 is preferably built using stainless steel members, which are easy to keep clean.

Cart 40 includes vertical fixed members 42 and 44 connected to horizontal fixed members 46 and 48. The end of the cart 40 defined by vertical fixed member 42 will be termed the front, while fixed member 44 is at the rear of the cart 40. The cart 40 is moved on wheels 50 attached thereto, with one set of wheels 50 preferably being pivotable so that the cart 40 can be steered. The wheels 50 are preferably made of conductive rubber to minimize the effects of static electricity.

A forward tube 52 and a rear tube 54 are rigidly connected together by a top tube 56. The forward and rear tubes 52, 54 are hollow, and slidably mounted upon the forward and rear fixed members 42, 44. Linear bearings are preferably used to allow the tubes 52, 54 to be easily moved vertically relative to the fixed members 42, 44, but any construction which allows a vertical movement of the forward and rear tubes 52, 54 can be substituted for the linear bearings. Stops (not shown) are included to limit movement of the forward and rear tubes 52, 54 to preselected maximum and minimum heights.

A counterweight 58 is suspended from a pulley 60 by a counterweight cable 62. The pulley 60 is suspended by a support member 64. The cable is attached to the forward tube 52 at an attachment point 66.

The purpose of the counterweight 58 arrangement is to provide an upward force on the assembly of the forward, rear, and top tubes 52, 54, 56. The mass of counterweight 58 is selected so as to just balance the weight of the upper tubes and everything attached to them, plus the weight of a typical cassette. This balancing force causes the upper tube assembly, when released, to remain motionless vertically rather than rising or falling. Without a cassette attached, the upper assembly will tend to rise to its higher stop.

A rod 68 extends through the top tube 56 and is slidably coupled thereto, preferably using linear bearings. A front pulley 70 is pivotally mounted on the front end of rod 68 and a rear pulley 72 is mounted on the rear end of rod 68. The pulleys 70, 72 are aligned into the same plane, and a cable 74 is wrapped around both pulleys in an endless loop.

A handle 76 is affixed to the rear pulley 72. A cassette holder 78 is affixed to the front pulley 70, so that rotation of front pulley 70 causes the cassette holder 78 to swing from side-to-side. Since the pulleys 70, 72 are connected by the cable 74, side-to-side rotation of the handle 76 causes a corresponding movement of the cassette holder 78 in the opposite direction.

Since the rod 68 is mounted inside the top tube 56 with a linear bearing, the rod 68 and all of its attached elements may be moved along the direction of the axis of the rod 68 relative to the top tube 56. Thus, if a user pushes the handle 76 forward, the cassette holder 78 will extend away from the cart 40. If the handle 76 is pulled back, the cassette holder 78 will be pulled back toward the cart 40. Rearward motion of the cassette handler 78 is prevented beyond a point defined by a stop 80.

Although the rod 68, pulleys 70, 72 and cable 74 are shown exposed, they are preferably covered by a flexible, non-contaminating material attached to the top tube 56. This prevents contamination from the mechanisms attached to the rod 68.

A fixed handle 81 is attached to the top tube 56 near the back end. This allows the entire cart 40 to be moved without using handle 76, which would tend to cause front and rear movement of the rod 68. Other handles can be attached as desired, or an electric motor attached to the wheels 50 can be used in conjunction with a control to move the cart 40.

Figure 4:
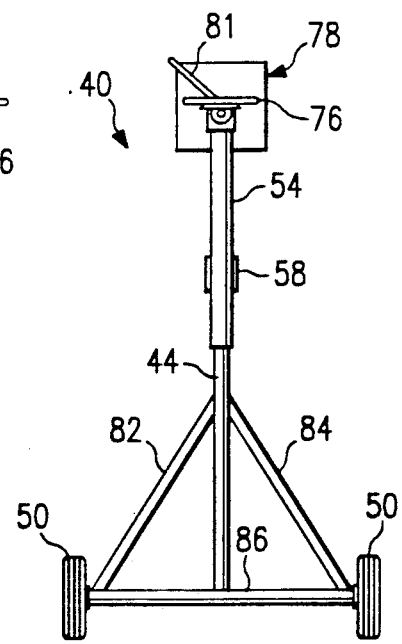
FIG. 4 is a rear view of the cart of FIG. 3.

A rear view of the cart 40 is shown in FIG. 4. From this position, additional structural details of the lower part of the cart 40 can be seen. Diagonal braces 82, 84 are used to connect the wheels 50 more firmly to the cart 40. Axle 86 also connects the wheels 50 to the lower end of rear vertical member 44. A corresponding front axle (not shown) and diagonal braces (not shown) attach the front wheels 50 to the front vertical member 42.

Although the dimensions of the cart 40 can be varied to suit a particular fabrication facility, a majority of the commonly available semiconductor fabrication equipment can be properly accessed by the cart 40 when the following preferred approximate dimensions are used. The cart 40 is preferably 18 to 24 inches wide in order to provide stability, and of a height which allows the upper assembly to have at least 12 inches of vertical travel. The rod 68 should be located approximately 29 inches from the floor when the top tube 56 is in its lowest position, and approximately 41 inches off the floor when the top tube 56 is in its upper position. The rod 68 is preferably able to move at least 12 inches along its axis, so that the cassette holder 78 is located at least 12 inches from the stop 80 when the rod 68 is fully extended forward. The front and rear wheels 50 are preferably a minimum of 18 inches apart in order to provide a desired minimum separation between a human user, holding onto the handle 76, and the wafer cassette attached to the carrier 78.

Referring to FIG. 5, a top view of the rod 68 and items attached thereto is shown in more detail. The remainder of the cart 40 including the top tube 56 is not shown in FIG. 5.

The cassette holder 78 includes a gripping portion 90 and a back plate 92. The gripping portion 90 and back plate 92 are connected by machine bolts 94, with the back plate 92 being pressed into contact with the gripping portion 90 by springs 96 wrapped around bolts 94. A pin 98 is also used to ensure correct relative positioning of the gripping portion 90 and back plate 92. The pin is affixed to one side, preferably the back plate, and is received in a hole (not shown) in the gripping portion 90.

As will be described below in connection with FIG. 7, the bolts 94 do not fixedly hold the back plate 92. Instead, they are fixedly attached only to the gripping portion 90. The springs 96 bias the back plate 92 into contact with the gripping portion 90, and the pin 98 serves to prevent relative rotation of the gripping portion 90 and back plate 92.

The gripping portion 90 has a height equal to one half the height of a cassette 10 so that it may be positioned against the lower half of the front side 14 of a cassette 10. The gripping portion 90 is then lifted up relative to the cassette 10, and handling tabs 16 are engaged by slots 100. The slots 100 have bottom faces so that continued lifting of the cassette holder 78 causes the entire cassette 10 to be lifted from its position.

As shown in FIG. 5, the handle 76 may be rotated to either the left or the right about the axis of rear pulley 72. Rotation of the handle 76 in a counterclockwise direction causes a corresponding rotation of the cassette holder 78 in a counterclockwise direction. Rotation of the handle 76 in a clockwise or counterclockwise direction can be used to position a held cassette 10 in any of the positions 22, 24, 26 as shown in FIG. 2.

When the handle 76 and cassette holder 78 are positioned as shown in FIG. 5, a cassette is placed in orientation 22. When the handle 76 and pulley 72 are rotated in a counterclockwise direction, the cassette holder 78 is also rotated to place a cassette in orientation 24. Rotation of the handle 76 and cassette holder 78 in the opposite direction places a cassette into orientation 26.

As described above, the rod 68 can also be rotated about its axis. When a cassette is positioned in orientation 24 or 26, rotation about the axis of rod 68 will place it in orientation 30 or 32 respectively. FIG. 6 shows a side view of the rod 68 assembly when a cassette has been placed in orientation 32. As can be seen in FIG. 6, the handle 76 was rotated 90° clockwise from the position shown in FIG. 5, and then lifted to a vertical position above the rod 68. Lifting the handle 76 to this vertical position rotated the rod 68, causing the cassette 10 to swing down into the position shown. The top side 12 of the cassette 10 faces out from the drawing toward the viewer. The front side 14 is now on top, and the wafers 18 are oriented horizontally.

In order to disengage the cassette holder 78 from the cassette 10, the cart 40 is moved. If, as preferred, rear wheels 50 are pivotable, the cart can easily be moved to slide the holder 78 away from the cassette. Alternatively, it is possible to place sliding members (not shown) between the top tube 56 and the vertical tubes 52, 54 to allow horizontal motion of the top tube 56 and mechanisms attached to the rod 68 relative to the rest of the cart 40.

Figure 7A:
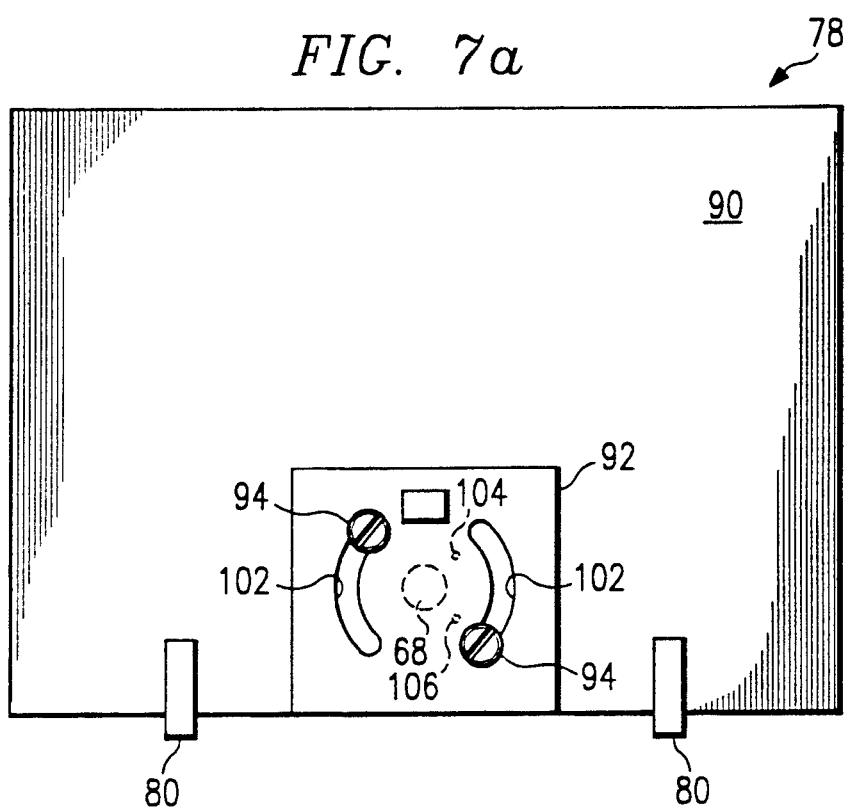
FIGS. 7a and 7b illustrate additional details of the mechanism of FIG. 5.
Figure 7B:
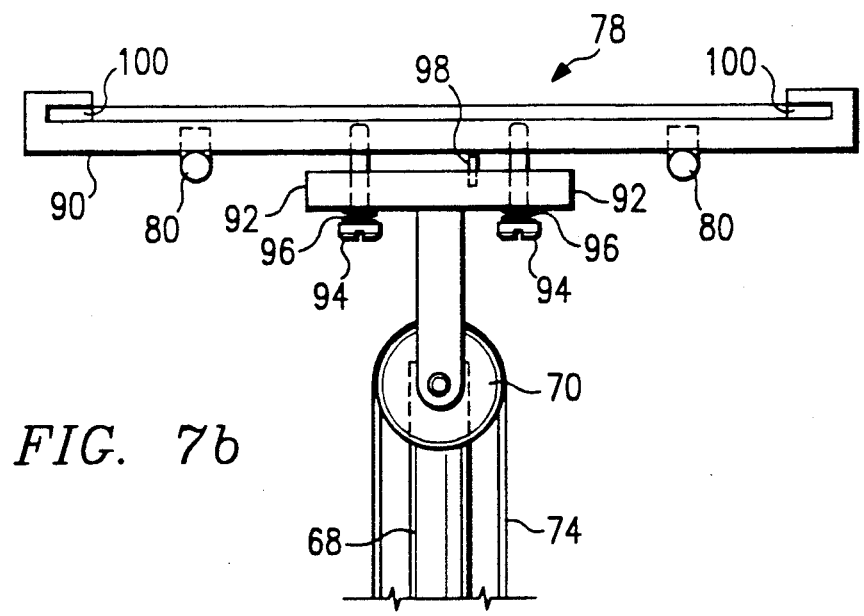

Additional details of construction necessary to place the cassette 10 into orientation 28 are shown in FIGS. 7a and 7b. In FIG. 7b, the rod 68 has been retracted until the front plate 90 presses against stops 80, which are affixed to the top tube 56. The rod 68 has been pulled back a little further, causing the springs 96 to be compressed, and pin 98 to disengage from its hole in the gripping portion 90.

FIG. 7a shows the gripping portion 90 and back plate 92 looking from the rear along the rod 68. Screws 94 are seen to be mounted diagonally opposite the center line of rod 68. Bolts 94 pass through slots 102 in the back plate 92. The relative positions of an upper pin hole 104 and lower pin hole 106, both located in the gripping portion 90, are indicated. When the gripping portion 90 and back plate 92 are relatively positioned as shown in FIGS. 5 and 7a, the pin 98 is aligned with upper pin hole 104.

When the back plate 92 has been retracted from the gripping portion 90 as shown in FIG. 7b, the rod 68 can be rotated by twisting the handle 76 in a clockwise direction. The gripping portion 90 is held in position by the stops 80, so that the back plate 92 rotates relatively thereto. The rod 68 is preferably aligned with the axis of rotation of the back plate 92, to improve feel and ease of use for an operator. Slots 102 allow movement of the back plate 92 relative to the gripping portion for an angle of 90° in a clockwise direction, at which location the pin 98 is aligned with lower pin hole 106. Releasing rearward pressure on the rod 68 allows the springs 96 to force the back plate 92 into contact with the gripping portion 90. Pin 98, when it is positioned in the lower pin hole 106, prevents undesired relative rotation of the gripping portion 90 and back plate 92.

Once the rotation just described has been accomplished, the pulleys 70 and 72 are oriented in a vertical direction, with their axles oriented horizontally, parallel to the plane of the gripping portion 90. The cassette holder 78 remains in the horizontal position. Lifting of the handle 76 to the position shown in FIG. 8 causes the cassette holder 90 to pivot down in a forward direction. As shown in FIG. 8, the cassette 10 is positioned in orientation 28, with the top side 12 facing away from the cart 40 and the front side 14 on top. Reversing the movements just described will return the cassette 10 to its normal orientation.

Thus, it can been seen that the mechanism described above allows a cassette to be positioned in any of the orientations illustrated in FIG. 2. Since the upper tube arrangement can be moved vertically, and the rod 68 can be moved axially to position the cassette holder 78 nearer to or further from the cart 40, tremendous flexibility is achieved in positioning the cassette 10. When the described preferred dimensions are used, the cart is suitable for use with most currently available semiconductor fabrication equipment. All of these orientations can be achieved with a minimal, simple effort on the part of the user, and practice has shown that the user quickly gets a feel for operation of the cart described.

A number of alternative mechanical arrangements will become apparent as appropriate substitutes to those skilled in the art. For example, the cart can be mounted on bases of varying shapes, such as a tripod shape having only three wheels. The counterweight 58, used to prevent vertical motion of the upper portion of the cart when it is not being held, can be replaced by any other mechanism which provides a relatively constant force. For example, a constant tension spring could be used instead of counterweight 58.

While the invention has been particularly shown and described with reference to a preferred embodiment, it will be understood by those skilled in the art that various changes in form and detail may be made therein without departing from the spirit and scope of the invention.

I claim:

1. A tool for manipulating semiconductor wafer cassettes, comprising:
    a supporting frame;
    a cassette holder supported at a front end of said frame;
    a manipulator supported at a back end of said frame; and
    linkage means connected to said cassette holder and to said manipulator for positioning said cassette holder in response to movement of said manipulator, wherein said cassette holder can, in response to movement of said manipulator, pivot horizontally about a vertical axis around a point located near the front end of said linkage means, whereby a cassette can be oriented in a plurality of positions relative to said frame.

2. The tool of claim 1, wherein said linkage means has a length greater than a minimum desired separation between cassettes and persons handling them.

3. The tool of claim 1, wherein said supporting frame is mobile.

4. The tool of claim 1, wherein said linkage means can be moved forwardly and rearwardly relative to said supporting frame, wherein said cassette holder can be positioned throughout a range of distances from said frame.

5. The tool of claim 1, wherein said linkage means can be rotated about a horizontal axis generally oriented between the cart front and back ends, wherein a cassette positioned at an angle of approximately 90 degrees from such axis can be placed in vertical positions by rotating said linkage means about such axis.

6. The tool of claim 1 further including:
    means for positioning said linkage means at any of a range of heights relative to said frame.

7. The tool of claim 6, wherein said positioning means includes means for retaining said linkage means at a preselected height.

8. The tool of claim 7, wherein said retaining means comprises a counterweight.

9. A tool for manipulating semiconductor wafer cassettes, comprising:
    a supporting frame;
    a cassette holder supported at a front end of said frame;
    a manipulator supported at a back end of said frame;
    a rod coupled to said frame, said rod being moveable toward the frame front end and toward the frame back end along an axis of said rod;
    front and back pulleys coupled to said rod at front and back ends thereof, said front pulley coupled to said cassette holder and said back pulley coupled to said manipulator; and
    a cable coupled to said front and back pulleys, wherein rotation of said back pulleys causes a corresponding rotation of said front pulley.

10. The tool of claim 9, wherein said rod can be rotated about the rod axis.

11. The tool of claim 10, wherein said cassette holder can be rotated relative to said rod about an axis parallel to the rod axis.

12. The tool of claim 11, wherein said cassette holder can be rotated 90 degrees relative to said rod.

13. The tool of claim 1, wherein said cassette holder engages cassettes by moving in a preferred direction relative to the cassettes.

14. A tool for manipulating semiconductor wafer cassettes, comprising:
    a supporting frame;
    a cassette holder supported at a front end of said frame;
    a manipulator supported at a back end of said frame; and
    linkage means connected to said cassette holder and to said manipulator for positioning said cassette holder in response to movement of said manipulator, wherein said cassette holder engages cassettes by moving in a preferred direction relative to the cassettes, wherein said cassette holder can, in response to movement of said manipulator, pivot horizontally about a vertical axis around a point located near the front end of said linkage means, whereby a cassette can be oriented in a plurality of positions relative to said frame, wherein the cassette holders have two tabs disposed in parallel on opposite sides thereof, and wherein said cassette holder includes two parallel slots which slidably engage the tabs.

* * * * *